United States Patent
Saraswatula et al.

(10) Patent No.: US 11,043,263 B1
(45) Date of Patent: Jun. 22, 2021

(54) LOW OFFSET AND ENHANCED WRITE MARGIN FOR STACKED FABRIC DIES

(71) Applicant: Xilinx, Inc., San Jose, CA (US)

(72) Inventors: Sree R K C Saraswatula, Hyderabad (IN); Abhimanyu Kumar, Jharkhand (IN); Santosh Yachareni, Hyderabad (IN); Shidong Zhou, Milpitas, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/683,846

(22) Filed: Nov. 14, 2019

(51) Int. Cl.
  *G11C 7/00* (2006.01)
  *G11C 11/419* (2006.01)
  *G11C 7/10* (2006.01)
  *G11C 11/412* (2006.01)

(52) U.S. Cl.
  CPC .......... *G11C 11/419* (2013.01); *G11C 7/1084* (2013.01); *G11C 7/1096* (2013.01); *G11C 11/412* (2013.01)

(58) Field of Classification Search
  CPC .......................................................... G11C 8/12
  USPC .................................................... 365/189.02
  See application file for complete search history.

(56) References Cited

U.S. PATENT DOCUMENTS

| | | | |
|---|---|---|---|
| 6,674,309 B1* | 1/2004 | Mercer | H03L 7/091 327/9 |
| 10,579,425 B1* | 3/2020 | Jacob | G06F 9/48 |
| 2006/0091965 A1* | 5/2006 | Boerstler | H03L 7/0893 331/17 |
| 2009/0122601 A1* | 5/2009 | Cho | G11C 13/0004 365/163 |

* cited by examiner

Primary Examiner — Hoai V Ho
(74) *Attorney, Agent, or Firm* — Patterson + Sheridan, LLP

(57) ABSTRACT

A device includes an amplifier, a plurality of selector circuitries, and a plurality of fabric dies. The amplifier is configured to output a supply power signal. Each selector circuitry of the plurality of selector circuitries receives the supply power signal from the amplifier. Each fabric die of the plurality of fabric dies has a corresponding selector circuitry of the plurality of selector circuitries. Each selector circuitry corresponding to a die of the plurality of dies is configured to provide the supply power signal received from the amplifier to its corresponding die responsive to a selection signal being asserted. Selector circuitries of the plurality of selector circuitries corresponding to unselected dies of the plurality of dies pull address supply power for the unselected dies to an input other than the supply power signal of the selector circuitries corresponding to the unselected die.

18 Claims, 7 Drawing Sheets

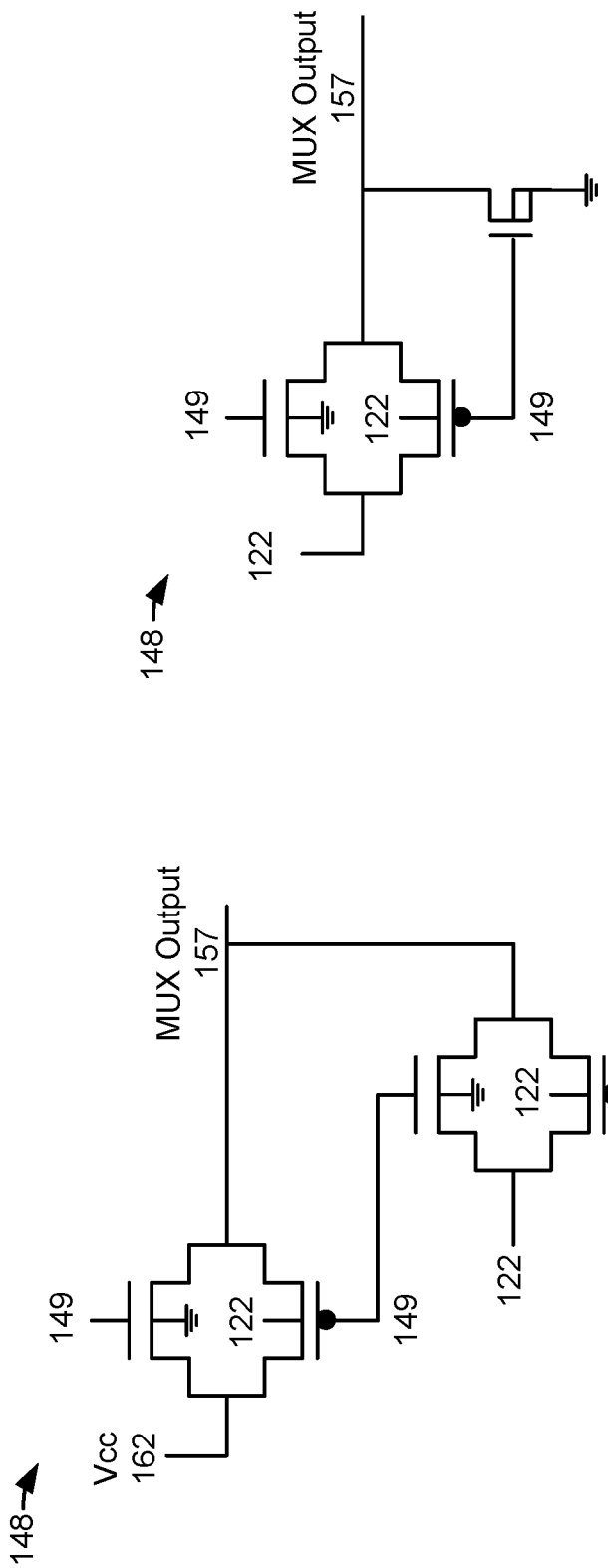

LOW OFFSET AND ENHANCED WRITE MARGIN FOR STACKED FABRIC DIES

TECHNICAL FIELD

The disclosure generally relates to reducing offset and improving write margin for a device and more particularly to improving the write margin for Static Random Access Memories (SRAM) cells on stacked fabric dies.

BACKGROUND

Typically, a unity gain buffer (UGB) may be used to generate and route analog address supply voltage to the address line drivers, the address line re-buffers, etc., in the fabric. Load increases as the number of stacked dies increases. Increasing the load increases the leakage and worsens the offset of the UGB and degrades the writability of the memory cell, resulting in yield loss. Degradation in writability causes problems for certain types of memory cells, e.g., SRAMs, since they may not have redundancy and as such must be functional beyond a certain threshold. Traditionally some have duplicated the analog UGB to address the offset and the write margin. However, duplicating the analog UGB takes up valuable space and causes metal congestion, which causes severe restrictions on columnar structure of stacked fabric dies of network on chip, horizontal sub region area, etc., to name a few.

SUMMARY

Accordingly, a need has arisen to reduce the offset, thereby improving the write margin in a stacked dies architecture while alleviating metal congestion and reducing the required space in comparison to the architecture where the UGB is duplicated multiple times. The proposed embodiments utilize a single UGB and a selector circuitry that selects which fabric die of the stacked fabric dies should receive the analog address supply voltage. According to some embodiment, the selector circuitry, e.g., a multiplexer, enables the selected die by routing power to the analog address supply of the selected die and disables the unselected dies, e.g., pulls down the analog address supply to ground for the unselected dies. Thus, the offset is reduced as a consequence of reduction of load and the write margin of SRAMs is improved. In some embodiments, a two stage UGB may be used to further reduce the offset. The proposed embodiments further reduce the number of through-silicon vias (TSV). The embodiments, improve the write margin of the configuration memory cells with reduced offset, thereby improving yield.

In some embodiments, a device includes an amplifier, a plurality of selector circuitries, and a plurality of fabric dies. The amplifier is configured to output a supply power signal. Each selector circuitry of the plurality of selector circuitries receives the supply power signal from the amplifier. Each fabric die of the plurality of fabric dies has a corresponding selector circuitry of the plurality of selector circuitries. Each selector circuitry corresponding to a die of the plurality of dies is configured to provide the supply power signal received from the amplifier to its corresponding die responsive to a selection signal being asserted. Selector circuitries of the plurality of selector circuitries corresponding to unselected dies of the plurality of dies pull address supply power for the unselected dies to an input other than the supply power signal of the selector circuitries corresponding to the unselected dies.

It is appreciated that in some embodiments the amplifier is a single stage unity gain buffer (UGB). In some embodiments, the amplifier is a two stage UGB. According to some embodiments, fabric dies of the plurality of fabric dies are stacked. It is appreciated that the fabric dies of the plurality of fabric dies are coupled through-silicon via (TSV) and the supply power signal is provided to each die of the plurality of dies via the TSV.

In some embodiments, a selector circuitry of the plurality of selector circuitries is a multiplexer configured to receive the supply power signal and a ground signal, and the multiplexer is further configured to receive its respective selection signal. The multiplexer is configured to route the supply power signal to its respective die of the plurality of dies responsive to the selection signal being asserted and the multiplexer is configured to pull down address supply power for its respective die of the plurality of dies to ground responsive to the selection being unasserted. In contrast, in some embodiments, the selector circuitry of the plurality of selector circuitries is a multiplexer configured to receive the supply power signal and a core voltage signal. The multiplexer is configured to route the supply power signal to its respective die of the plurality of dies responsive to the selection signal being asserted and the multiplexer is configured to pull up address supply power to the core voltage signal for its respective die of the plurality of dies responsive to the selection being unasserted.

According to some embodiments, the amplifier is positioned on an input/output (I/O) die and wherein the plurality of fabric dies is positioned within a fabric. In some embodiments, each fabric die of the plurality of fabric dies comprises memory cell pass gate, address line drivers, and address line re-buffers.

It is appreciated that in some embodiments, the device may further include a multiplexer configured to receive a read signal, a write signal, and a selection signal configured to select whether a read operation or a write operation is being performed. The multiplexer in response thereto routes either the read signal or the write signal to the amplifier.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIGS. 2A-2B show illustrative selector circuitries for selecting a desired fabric die, according to some examples.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
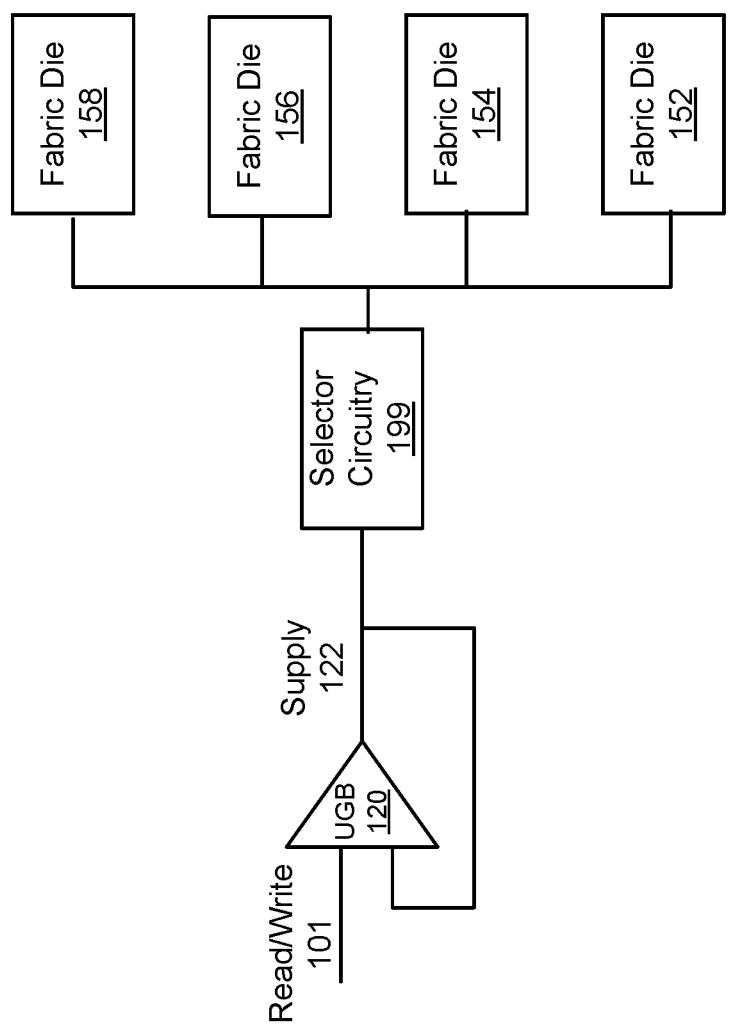
FIGS. 1A-1B show block diagram depicting a device with reduced offset and improved write margin, according to some examples.

Examples described herein relate to a device with reduced offset and improved write margin. The embodiments are directed to a device with stacked dies where metal congestion is alleviated and the required space is reduced in comparison to the architecture where the UGB is duplicated multiple times. The proposed embodiments utilize a single UGB and a selector circuitry that selects which fabric die of the stacked fabric dies should receive power for the analog address supply. According to some embodiments, the selector circuitry, e.g., a multiplexer, enables the selected die by routing power to the analog address supply to the selected die and disables the unselected dies, e.g., pulls down the analog address supply for the unselected dies to ground. Thus, the offset is reduced and the write margin is improved. In some embodiments, a two stage UGB may be used to further reduce the offset. The proposed embodiments further reduce the number of TSVs. The embodiments improve the write margin of the configuration memory cells with reduced offset, thereby improving yield.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. For example, various methods according to some examples can include more or fewer operations, and the sequence of operations in various methods according to examples may be different than described herein. In addition, an illustrated example need not have all the aspects or advantages shown. An aspect or an advantage described in conjunction with a particular example is not necessarily limited to that example and can be practiced in any other examples even if not so illustrated or if not so explicitly described.

Some general concepts will first be described to clarify terms and nomenclature used throughout this description.

Figure 1B:
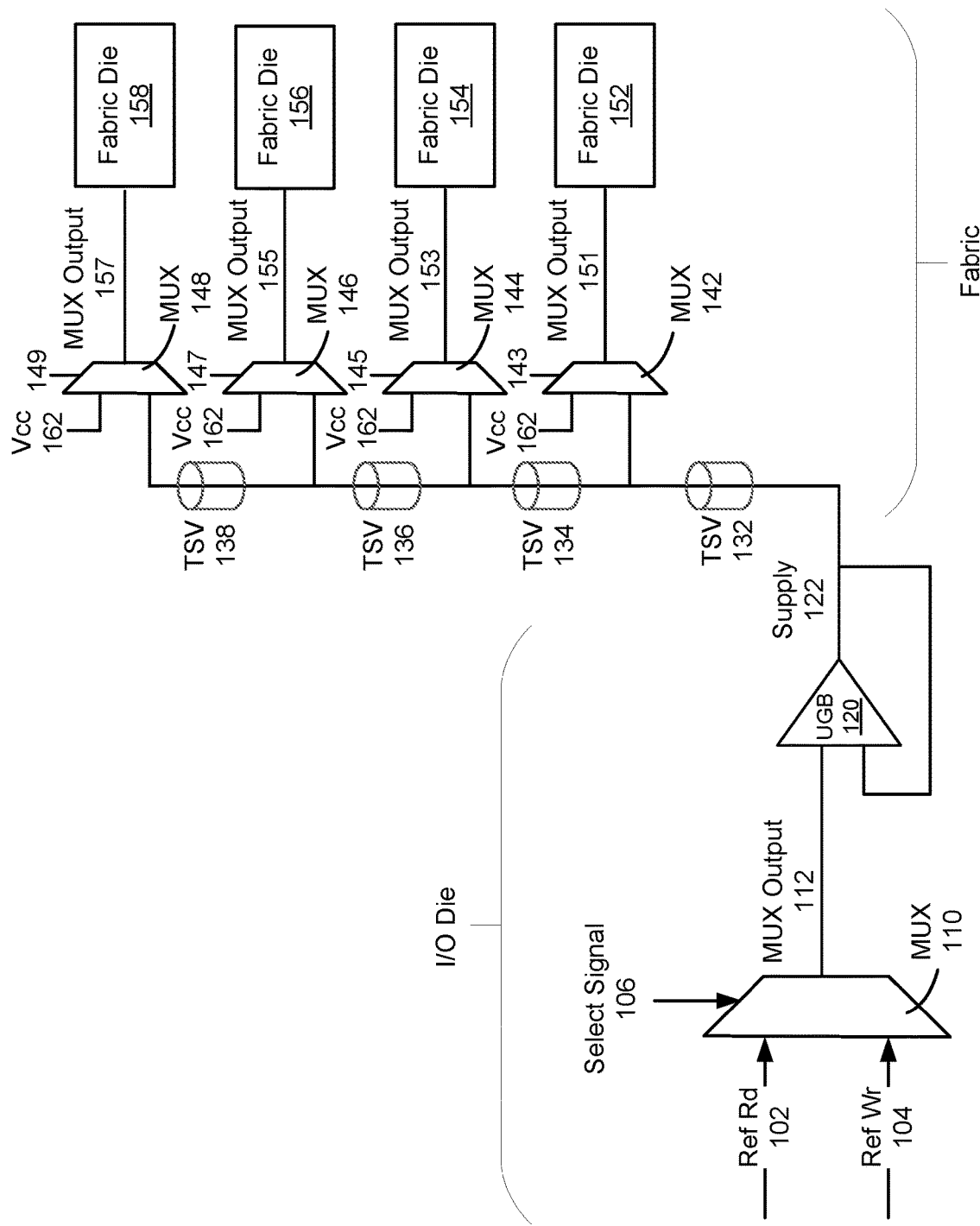

FIGS. 1A-1B show block diagrams depicting a device with reduced offset and improved write margin, according to some examples. Referring specifically to FIG. 1A, an amplifier 120, e.g., a unity gain buffer (UGB), receives a signal, e.g., read or write 101, to indicate whether the operation to be performed is a read or write. In response to receiving the read or write signal the amplifier 120 outputs the appropriate supply power signal 122. In some embodiments, the write signal requires a higher power than a read signal. A selector circuitry 199 receives the supply power signal 122. It is appreciated that the selector circuitry 199 may also receive a signal (not shown in FIG. 1A) indicating a selected die and in response thereto the selector circuitry 199 provides the supply power signal 122 to the selected die, e.g., fabric die 154, from a plurality of dies, e.g., dies 152, 154, 156, and 158.

It is appreciated that the fabric die may include a plurality of configuration memory cells such as SRAMs. In some embodiments, the selector circuitry 199 in addition to routing the supply power signal 122 to the selected die that enables the selected die, also disables the unselected dies, e.g. fabric dies 152, 156, and 158 in this instance, by for example pulling down the address supply power to ground for the unselected dies. In some illustrative examples, the unselected dies are disabled by pulling the analog address supply power to a core voltage of the die. It is appreciated that pulling up the unselected die to the core voltage of the die might cause unintended forward bias junctions if the bulk and source/drain connections are not appropriate voltages. Thus, it is more desirable to pull down the analog address supply power to ground in order to disable the unselected die. It is appreciated that the device as shown in FIGS. 1A and 1B may be implemented in a field programmable gate array (FPGA), application specific integrated circuit (ASIC), or any device with distributed memory cells.

It is appreciated that since a selector circuitry 199 selects a die to be enabled and disables unselected dies, this reduces the load on the UGB, hence reduces the offset and improves the write margin and yield. Furthermore, since a single amplifier, e.g., UGB 120, is used, duplication of UGB is eliminated, thus alleviating metal congestion and reducing the required space in comparison to the architecture where the UGB is duplicated multiple times. In some embodiments, the UGB 120 may be a two stage UGB instead of a single stage UGB to further reduce the offset. The embodiments as discussed further reduce the number of TSVs. It is appreciated that in some embodiments, only one die fabric at the time is active, hence selected, while all other fabric dies are unselected and are hence deactivated.

Referring now to FIG. 1B, another embodiment illustrating a device with reduced offset and improved write margin according to some embodiments is shown. It is appreciated that the selector circuitry 199 of FIG. 1A may include a plurality of multiplexer 142, 144, 146, and 148, as shown in FIG. 1B.

In this embodiment, a multiplexer 110 receives a reference read signal 102 and a reference write signal 104. The multiplexer 110 also receives a selection signal 106 that selects whether the operation is a read operation or a write operation. The multiplexer 110 outputs a mux signal 112 based on whether a write operation is being performed or a read operation is being performed. In some embodiments a write operation requires a higher supply voltage. The mux output signal 112 is input to the UGB 120. The UGB 120 generates a supply power signal 122 based on the mux output signal 112. The supply power signal 122 is routed to every fabric die (in this illustrative embodiment the dies are stacked) using a plurality of TSVs 132, 134, 136, and 138.

In one embodiment, each fabric die may have its corresponding multiplexer. For example, the fabric die 152 has its corresponding multiplexer 142, the fabric die 154 has its corresponding multiplexer 144, the fabric die 156 has its corresponding multiplexer 146, and the fabric die 158 has its corresponding multiplexer 148. Each multiplexer receives the supply power signal 122 as one of its input that is received using a TSV. For example, the multiplexer 142 receives the supply power signal 122 using TSV 132. The multiplexer 144 receives the supply power signal 122 using TSV 134. The multiplexer 146 receives the supply power signal 122 using TSV 136 and the multiplexer 148 receives the supply power signal 122 using TSV 138. Each of the multiplexers 142, 144, 146 and 148 may also receive another signal as its input, e.g., VCC 162 that is a core voltage signal for each die. Each of the multiplexers 142, 144, 146, and 148 also receive a corresponding selection signal 143, 145, 147, and 149 respectively. The selection signal for each multiplexer makes a selection whether the corresponding die of the multiplexer is being selected or unselected. For example, the selection signal 143 identifies whether the fabric die 152 is being selected or unselected. Similarly, the selection signal 145 identifies whether the fabric die 154 is being selected or unselected, etc.

Each of the multiplexers 142, 144, 146, and 148 outputs a respective mux output signal 151, 153, 155, and 157. Each mux output signal 151, 153, 155, and 157 either routes the supply power signal 122 to the respective die or it pulls up the analog address supply to VCC 162. For example, in this illustrative example if the fabric die 154 is selected and other fabric dies 152, 156, and 158 are unselected then the mux output signal 153 is the supply power signal 122 that is being routed to the fabric die 154 whereas each of the other fabric dies 152, 156, and 158 receive the VCC 162 voltage indicating that they are being unselected. As discussed above, pulling up the analog address supply may cause forward bias.

It is appreciated that in some embodiments, the TSVs 132-138, the multiplexers 142-148, and the fabric dies 152-158 are positioned in the fabric while the multiplexer 110 and the UGB 120 are positioned off the fabric, e.g., on input/output (I/O) die.

It is appreciated that placing the UGB 120 and the multiplexer 110 on an I/O die and using the selector circuitries, e.g., multiplexers 142, 144, 146, and 148, in the fabric enables the fabric dice to be controlled in one-hot configuration on the address supply line (also referred to as the supply power signal 122) that is routed to the fabric dies 152-158 through TSVs 132-138. Placing the UGB 120 and the multiplexer 110 on an I/O die instead of the fabric reduces metal congestion in the fabric. Moreover, since less than all dies are selected at any given time (e.g., only one fabric die is active at the time), using the selector circuitries, e.g., multiplexers 142-148, the leakage and offset are reduced and the write margin is improved. In some embodiments, a two stage UGB may be used to further reduce the offset. The embodiments as described further reduce the number of TSV. The embodiments, improve the write margin of the configuration memory cells with reduced offset, thereby improving yield.

It is appreciated that the embodiments show four fabric dies, four selector circuitries, etc. for illustrative purposes only. However, any number of components may be used, e.g., two fabric dies and two selector circuitries may be used. As such, the number of components is for illustrative purposes only and should not be construed as limiting the scope of the embodiments.

FIGS. 2A-2B show illustrative selector circuitries, e.g., multiplexer 148, for selecting a desired fabric die, e.g., fabric die 158, according to some examples. Referring specifically to FIG. 2A, the multiplexer 148 comprising pmos and cmos transistors is shown. The multiplexer 148 in response to the selection signal 149 being asserted routes the supply power signal 122 to the fabric die 158. In contrast, the multiplexer 148 in response the selection signal 149 being unasserted, pulls the supply power signal of the fabric die 158 to Vcc 162, hence core signal. As discussed above, pulling the supply power signal of the fabric to core signal causes forward bias. In contrast, FIG. 2B shows a similar architecture except that the fabric die 158 is pulled down to ground in response to the selection signal 149 being unasserted. As such, forward biasing issues resulting from pulling up the analog address supply line for unselected dies are addressed by pulling them down to ground.

Figure 3:
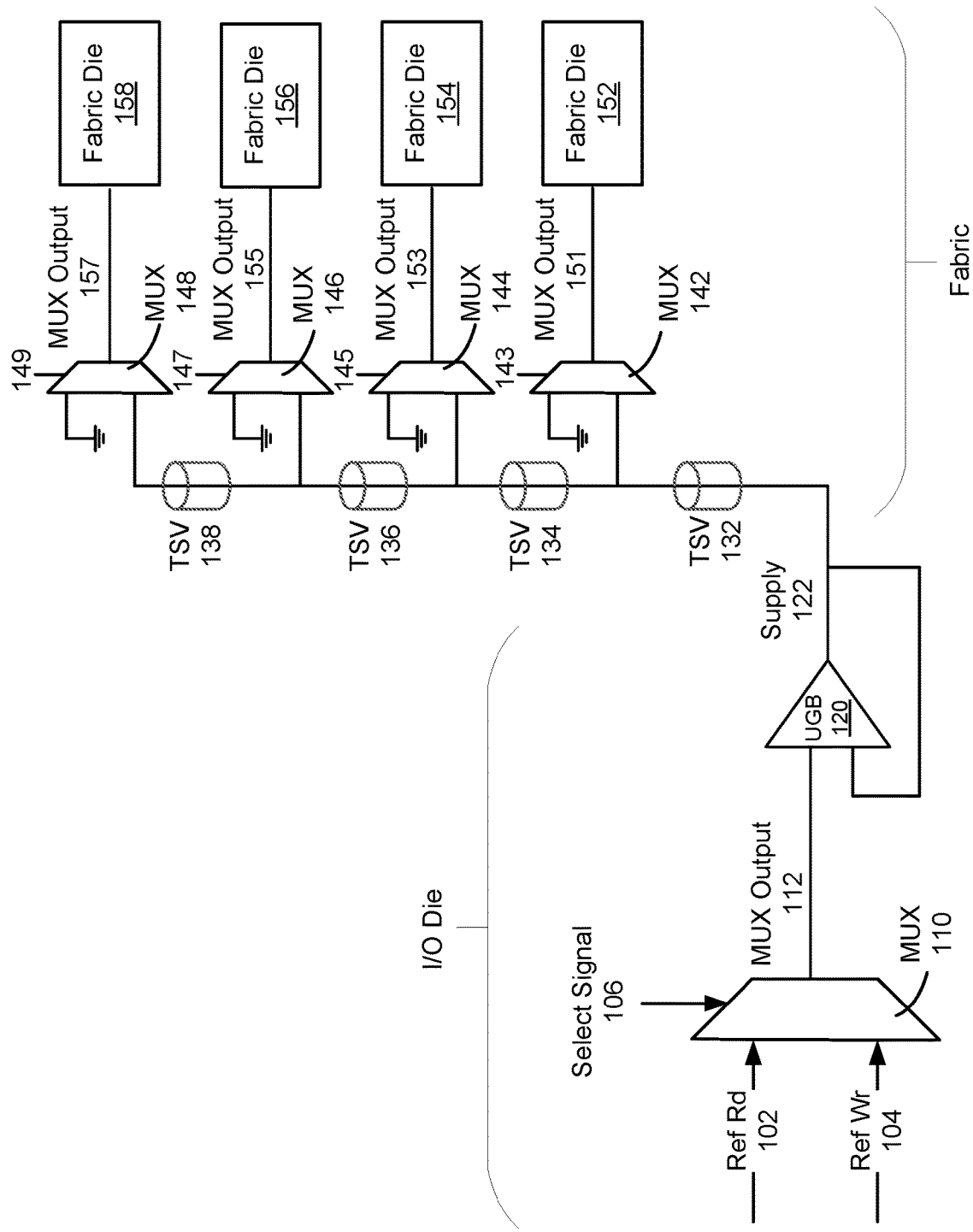
FIG. 3 shows an illustrative block diagram depicting a device with reduced offset and improved write margin, according to some examples.

FIG. 3 shows an illustrative block diagram depicting a device with reduced offset and improved write margin, according to some examples. FIG. 3 is substantially similar to that of FIG. 1B. However, in this architecture the multiplexers 142, 144, 146, and 148 have one input grounded instead of Vcc 162 in order to address the forward biasing issue. Accordingly, the analog address supply for unselected fabric dies are grounded while the analog address supply for the selected die is powered with the supply power signal 122.

Figure 4:
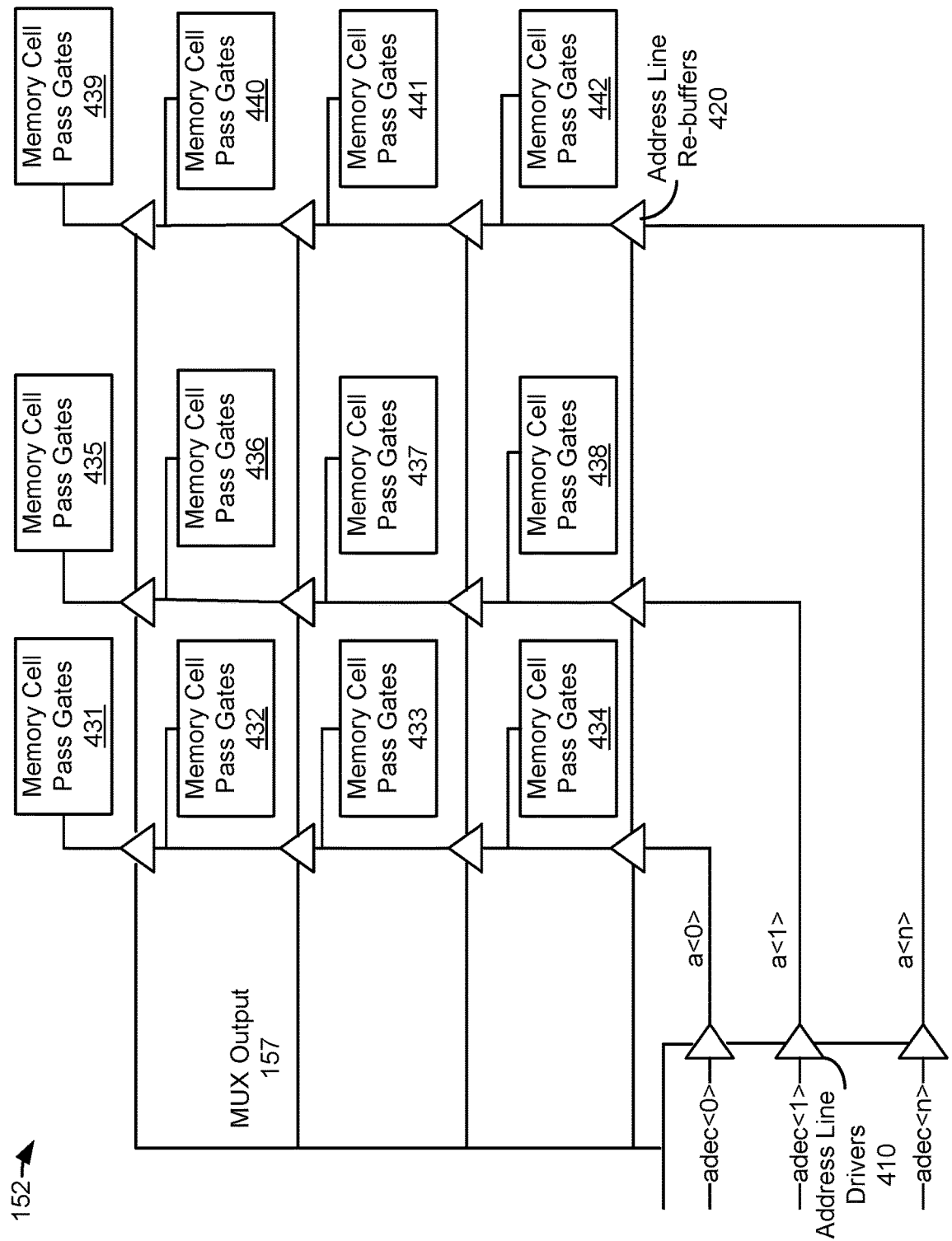
FIG. 4 shows configuration memory cells of a fabric die, according to some examples.

FIG. 4 shows configuration memory cells of a fabric die, according to some examples. It is appreciated that each fabric die may include configuration memory cells. For example, the fabric die 152 may include a plurality of address line drivers 410, a plurality of address line re-buffers 420, and a plurality of memory cell pass gates 431-442. Configuration frames (CFRM) may be received through address line drivers 410. The frames may be separated, e.g., a<0>, a<1>, . . . , a<n>. The address line re-buffers 420 may be used in order to speed up the read and write operations and to have a higher slew rate. It is appreciated that each address line re-buffer drives its respective memory cell pass gates with an address line. In some embodiments, frames a<0>, a<1>, . . . , a<n> are driven by the address line re-buffers to their respective memory cell pass gates. For example, frame a<0> is driven to memory cell pass gates 431-434 using its respective address line re-buffers, frame a<1> is driven to memory cell pass gates 435-438 using its respective address line re-buffers, etc.

Figure 5:
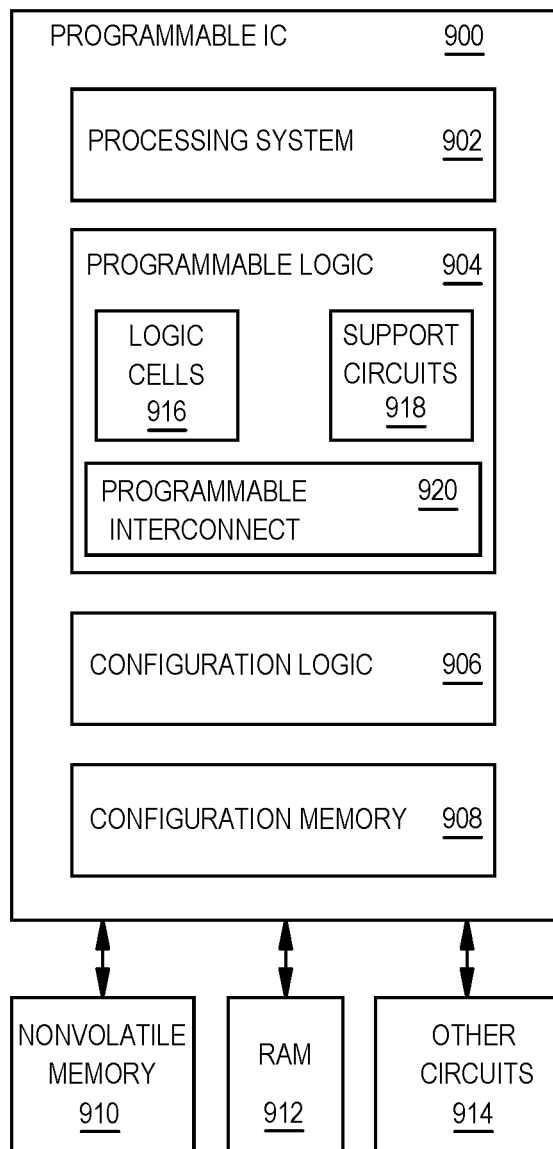
FIG. 5 is a block diagram depicting a programmable integrated circuit (IC), according to some examples.

FIG. 5 is a block diagram depicting a programmable integrated circuit (IC) 900 according to an example. The programmable IC 900 can implement the integrated circuit (IC) chip of systems of FIGS. 1A-4, in whole or in part. The programmable IC 900 includes a processing system 902, programmable logic 904, configuration logic 906, and configuration memory 908. The programmable IC 900 can be coupled to external circuits, such as nonvolatile memory 910, RAM 912, and other circuits 914.

In the example of FIG. 5, the processing system 902 can include microprocessor(s), memory, support circuits, IO circuits, and the like. The programmable logic 904 includes logic cells 916, support circuits 918, and programmable interconnect 920. The logic cells 916 include circuits that can be configured to implement general logic functions of a plurality of inputs. The support circuits 918 include dedicated circuits, such as transceivers, input/output blocks, digital signal processors, memories, and the like. The logic cells and the support circuits 918 can be interconnected using the programmable interconnect 920. Information for programming the logic cells 916, for setting parameters of the support circuits 918, and for programming the programmable interconnect 920 is stored in the configuration memory 908 by the configuration logic 906. The configuration logic 906 can obtain the configuration data from the nonvolatile memory 910 or any other source (e.g., the RAM 912 or from the other circuits 914).

Figure 6:
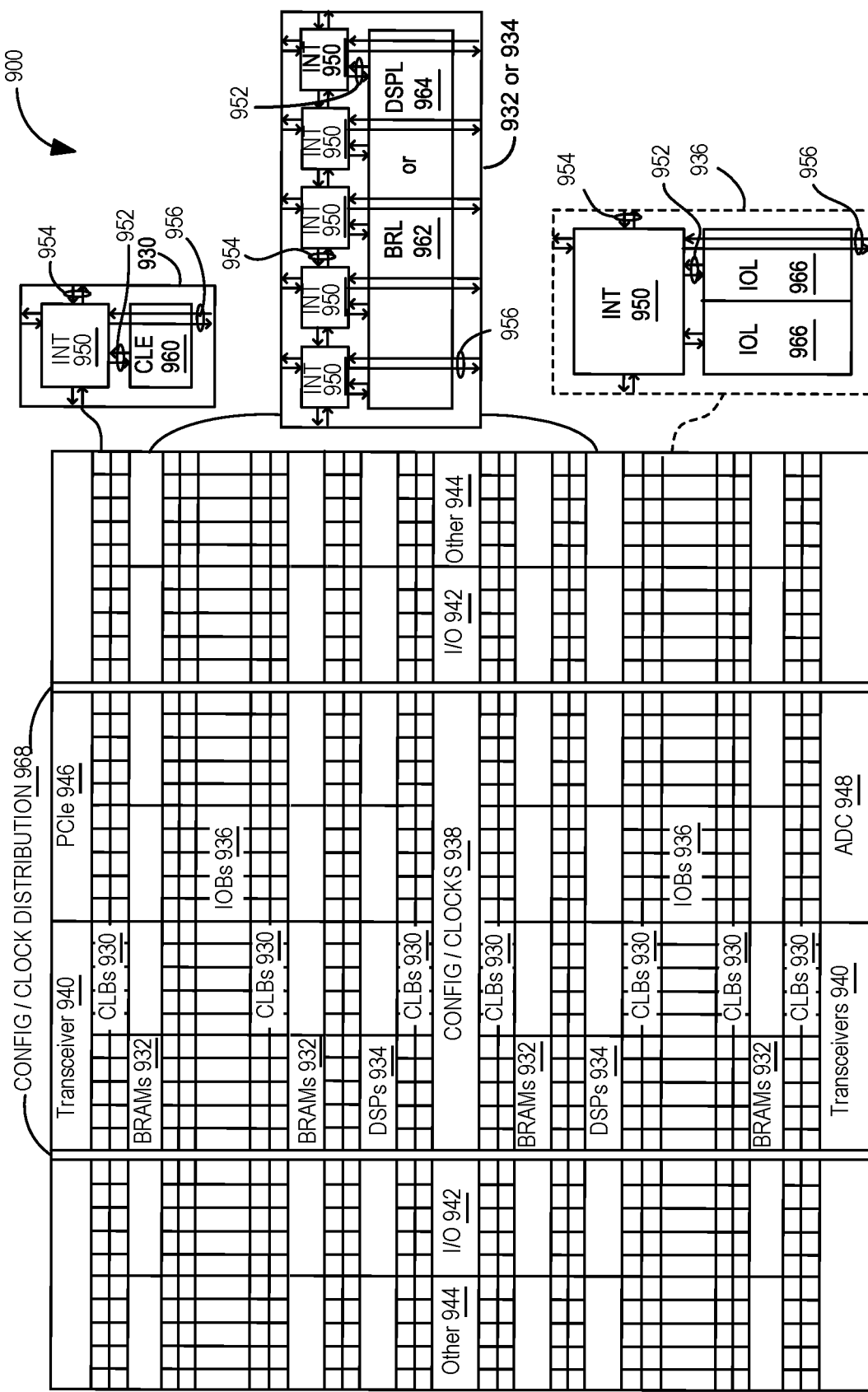
FIG. 6 is a field programmable gate array (FPGA) implementation of the programmable IC, according to some examples.

FIG. 6 illustrates an FPGA implementation of the programmable IC 900 that includes a large number of different programmable tiles including configurable logic blocks ("CLBs") 930, random access memory blocks ("BRAMs") 932, signal processing blocks ("DSPs") 934, input/output blocks ("IOBs") 936, configuration and clocking logic ("CONFIG/CLOCKS") 938, digital transceivers 940, specialized input/output blocks ("I/O") 942 (e.g., configuration ports and clock ports), and other programmable logic 944 such as digital clock managers, system monitoring logic, and so forth. The FPGA can also include PCIe interfaces 946, analog-to-digital converters (ADC) 948, and the like.

In some FPGAs, each programmable tile can include at least one programmable interconnect element ("INT") 950 having connections to input and output terminals 952 of a programmable logic element within the same tile, as shown by examples included in FIG. 6. Each programmable interconnect element 950 can also include connections to interconnect segments 954 of adjacent programmable interconnect element(s) in the same tile or other tile(s). Each programmable interconnect element 950 can also include connections to interconnect segments 956 of general routing resources between logic blocks (not shown). The general routing resources can include routing channels between logic blocks (not shown) comprising tracks of interconnect segments (e.g., interconnect segments 956) and switch blocks (not shown) for connecting interconnect segments. The interconnect segments of the general routing resources (e.g., interconnect segments 956) can span one or more logic blocks. The programmable interconnect elements 950 taken together with the general routing resources implement a programmable interconnect structure ("programmable interconnect") for the illustrated FPGA.

In an example implementation, a CLB 930 can include a configurable logic element ("CLE") 960 that can be programmed to implement user logic plus a single programmable interconnect element ("INT") 950. A BRAM 932 can include a BRAM logic element ("BRL") 962 in addition to one or more programmable interconnect elements. Typically, the number of interconnect elements included in a tile depends on the height of the tile. In the pictured example, a BRAM tile has the same height as five CLBs, but other numbers (e.g., four) can also be used. A signal processing block 934 can include a DSP logic element ("DSPL") 964 in addition to an appropriate number of programmable interconnect elements. An IOB 936 can include, for example, two instances of an input/output logic element ("IOL") 966 in addition to one instance of the programmable interconnect element 950. As will be clear to those of skill in the art, the actual I/O pads connected, for example, to the input/output logic element 966 typically are not confined to the area of the input/output logic element 966.

In the pictured example, a horizontal area near the center of the die is used for configuration, clock, and other control logic. Vertical columns 968 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A device comprising:
an amplifier configured to output a supply power signal;
a plurality of selector circuitries, wherein each selector circuitry of the plurality of selector circuitries receives the supply power signal from the amplifier; and
a plurality of fabric dies, wherein each fabric die of the plurality of fabric dies has a corresponding selector circuitry of the plurality of selector circuitries, wherein each selector circuitry corresponding to a die of the plurality of dies is configured to provide the supply power signal received from the amplifier to its corresponding die responsive to a selection signal being asserted, wherein selector circuitries of the plurality of selector circuitries corresponding to unselected dies of the plurality of dies pull address supply power for the unselected dies to an input other than the supply power signal of the selector circuitries corresponding to the unselected dies, wherein the address supply power is pulled to a core voltage of the unselected dies, and wherein the core voltage is Vcc.

2. The device of claim 1, wherein the amplifier is a single stage unity gain buffer (UGB).

3. The device of claim 1, wherein the amplifier is a two stage unity gain buffer (UGB).

4. The device of claim 1, wherein fabric dies of the plurality of fabric dies are stacked.

5. The device of claim 4, wherein the fabric dies of the plurality of fabric dies are coupled through-silicon via (TSV) and wherein the supply power signal is provided to each die of the plurality of dies via the TSV.

6. The device of claim 1, wherein a selector circuitry of the plurality of selector circuitries is a multiplexer configured to receive the supply power signal and a core voltage signal, and the multiplexer is further configured to receive its respective selection signal, and wherein the multiplexer is configured to route the supply power signal to its respective die of the plurality of dies responsive to the selection signal being asserted and wherein the multiplexer is configured to pull up address supply power to the core voltage signal for its respective die of the plurality of dies responsive to the selection signal being unasserted.

7. The device of claim 1, wherein the amplifier is positioned on an input/output (I/O) die and wherein the plurality of fabric dies is positioned within a fabric.

8. The device of claim 1, wherein each fabric die of the plurality of fabric dies comprises memory cell pass gate, address line drivers, and address line re-buffers.

9. The device of claim 1 further comprising a multiplexer configured to receive a read signal, a write signal, and a selection signal configured to select whether a read operation or a write operation is being performed and wherein the multiplexer in response thereto routes either the read signal or the write signal to the amplifier.

10. A device comprising:
a unity gain buffer (UGB) amplifier configured to output a supply power signal;
a plurality of fabric dies coupled to the UGB amplifier; and
a selector circuitry configured to receive the supply power signal and wherein the selector circuitry is further configured to select one fabric die of the plurality of fabric dies based on a selection signal, wherein the selector circuitry is further configured to route the supply power signal to the selected one fabric die, wherein the selector circuitry is further configured to pull unselected dies to a core voltage of the unselected dies, and wherein the core voltage is Vcc.

11. The device of claim 10, wherein fabric dies of the plurality of fabric dies are stacked.

12. The device of claim 11, wherein the fabric dies of the plurality of fabric dies are coupled through-silicon via (TSV) and wherein the supply power signal is provided to each die of the plurality of dies via the TSV.

13. The device of claim 10, wherein the UGB amplifier is a single stage UGB amplifier.

14. The device of claim 10, wherein the UGB amplifier is a two stage UGB amplifier.

15. The device of claim 10, wherein the UGB amplifier is positioned on an input/output (I/O) die and wherein the plurality of fabric dies is positioned within a fabric.

16. The device of claim 10, wherein each fabric die of the plurality of fabric dies comprises memory cell pass gate, address line drivers, and address line re-buffers.

17. The device of claim 10, wherein selector circuitry is further configured to pull up address supply power to a core voltage for unselected dies of the plurality of dies.

18. The device of claim 10 further comprising a multiplexer configured to receive a read signal, a write signal, and a selection signal configured to select whether a read operation or a write operation is being performed and wherein the multiplexer in response thereto routes either the read signal or the write signal to the UGB amplifier.

* * * * *